United States Patent
Yamaguchi

(10) Patent No.: US 6,757,873 B2
(45) Date of Patent: Jun. 29, 2004

(54) SIMULATOR OF SEMICONDUCTOR DEVICE CIRCUIT CHARACTERISTIC AND SIMULATION METHOD

(75) Inventor: Tetsuya Yamaguchi, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 291 days.

(21) Appl. No.: 09/964,048

(22) Filed: Sep. 26, 2001

(65) Prior Publication Data

US 2002/0037596 A1 Mar. 28, 2002

(30) Foreign Application Priority Data

Sep. 26, 2000 (JP) .................................... P2000-292770

(51) Int. Cl.$^7$ ............................................. G06F 17/50
(52) U.S. Cl. ........................................... 716/2; 703/20
(58) Field of Search ................. 716/2, 4, 5; 703/13, 703/14, 20

(56) References Cited

U.S. PATENT DOCUMENTS

| | | | | |
|---|---|---|---|---|
| 5,301,118 A | * | 4/1994 | Heck et al. ................. | 700/109 |
| 5,418,974 A | * | 5/1995 | Craft et al. ................. | 716/2 |
| 5,548,539 A | * | 8/1996 | Vlach et al. ................. | 703/6 |
| 5,886,906 A | * | 3/1999 | Tatsumi et al. ............... | 703/14 |
| 6,035,115 A | * | 3/2000 | Suzuki ........................ | 703/15 |
| 6,304,836 B1 | * | 10/2001 | Krivokapic et al. .......... | 703/14 |

\* cited by examiner

*Primary Examiner*—Stacy A. Whitmore
(74) *Attorney, Agent, or Firm*—Brenda O. Holmes; Kilpatrick Stockton LLP

(57) ABSTRACT

First characteristic values (SS, FF) which fluctuate most of the characteristic of a device composing a semiconductor device are obtained according to a fluctuation of manufacturing process for the semiconductor device. Next, the width (optimized K value) of a fluctuation width of manufacturing process which matches second characteristic values (C1, C16) of the worst cases of the characteristic of this device with the first characteristic values (SS, FF) is determined. Finally, a third characteristic value of the worst case of the circuit characteristic of the semiconductor device is determined based on this fluctuation width (optimized K value).

12 Claims, 11 Drawing Sheets

| Case No. | ΔL | ΔTox | ΔNch(nFET) | ΔNch(pFET) |
|---|---|---|---|---|
| 1 | + | + | + | + |
| 2 | + | + | + | − |
| 3 | + | + | − | + |
| 4 | + | + | − | − |
| 5 | + | − | + | + |
| 6 | + | − | + | − |
| 7 | + | − | − | + |
| 8 | + | − | − | − |
| 9 | − | + | + | + |
| 10 | − | + | + | − |
| 11 | − | + | − | + |
| 12 | − | + | − | − |
| 13 | − | − | + | + |
| 14 | − | − | + | − |
| 15 | − | − | − | + |
| 16 | − | − | − | − | ial
SIMULATOR OF SEMICONDUCTOR DEVICE CIRCUIT CHARACTERISTIC AND SIMULATION METHOD

CROSS REFERENCE TO RELATED APPLICATIONS

This application is based upon and claims the benefit of priority from the Japanese Patent applications No. P2000-292770, filed on Sep. 26, 2000; the entire contents of which are incorporated herein by reference

BACKGROUND OF THE INVENTION

1. Field of the Invention

The present invention concerns the circuit design of a semiconductor device such as LSI and is particularly for application in the estimation of a fluctuation of the circuit characteristic, as generated by process fluctuation.

2. Description of the Related Art

Securing a high yield rate from the early stages of mass production is very important for the semiconductor devices, especially, LSI products. The reason is that the high yield rate leads to reduction of cost and turnaround time (TAT). This yield rate rises or falls due to fluctuation of the circuit characteristics. The factor which causes circuit characteristic fluctuation is manufacturing process fluctuation. If the manufacturing process did not fluctuate at all, the circuit characteristic also would not fluctuate, and if the circuit operation could be thus assured, the yield rate of the LSI product could always kept at 100%. However, in practice, it is impossible to remove completely manufacturing process fluctuation.

In order to obtain a high yield rate, it is necessary to estimate the fluctuation of the circuit characteristic due to the fluctuation of the manufacturing process with high accuracy and optimize the circuit based on that estimation result.

However, the estimated device and circuit characteristics sometimes do not coincide with the actual, measured values of the semiconductor device. That is to say, estimated values which emerge in simulation, may not always correspond to those found in practice.

SUMMARY OF THE INVENTION

The method for simulating the circuit characteristic of the semiconductor device according to the embodiment of the prevent invention is the obtaining a first characteristic value which most fluctuates a characteristic of an element composing the semiconductor device according to a fluctuation of a parameter of the element; the determining a width of the fluctuation of the parameter which matches a second characteristic value of the worst case of the characteristic of the element with the first characteristic value; and the determining a third characteristic value of the worst case of the circuit characteristic of the semiconductor device based on the width of the fluctuation.

DETAILED DESCRIPTION OF THE EMBODIMENTS

Figure 1:
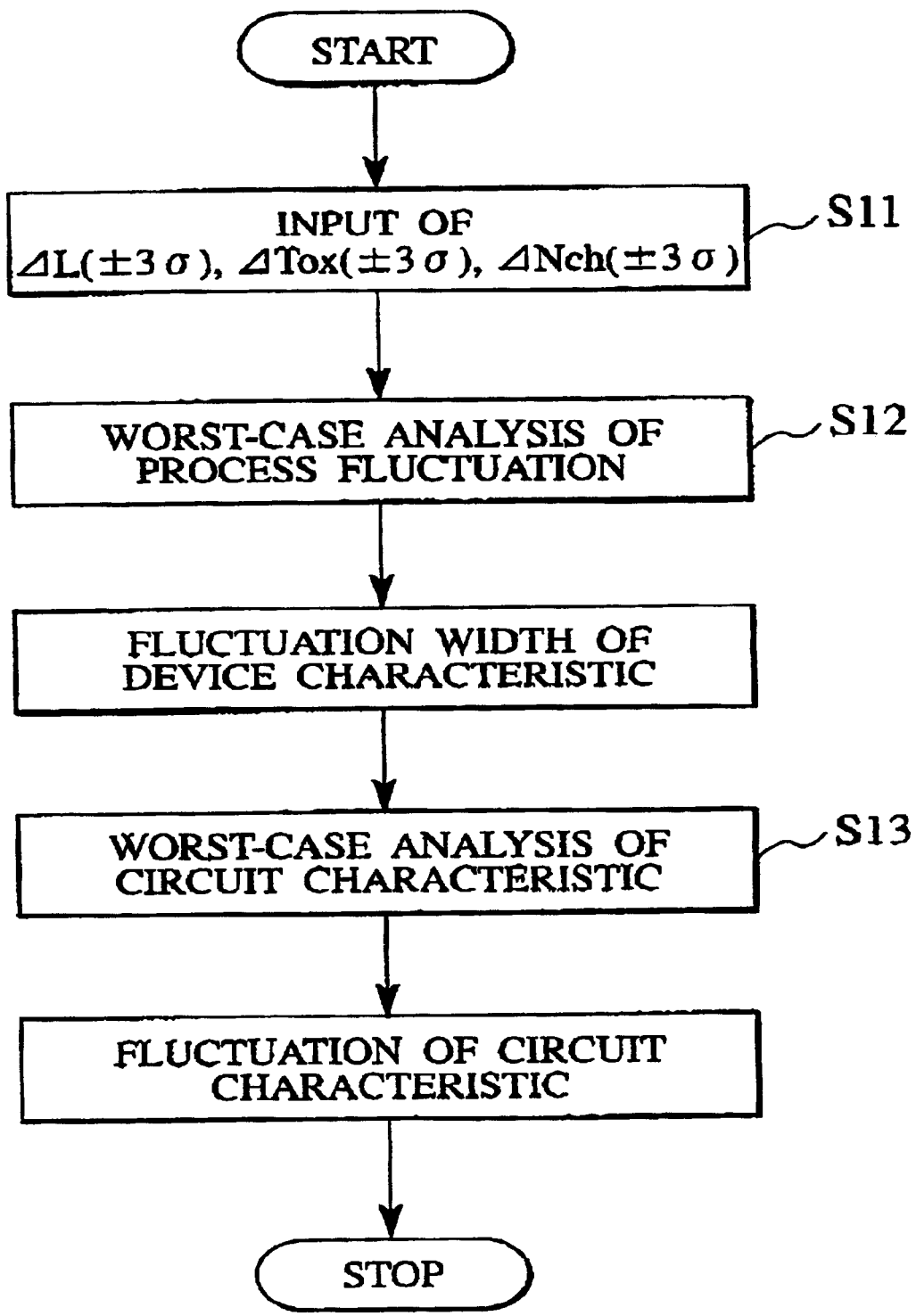
FIG. 1 is a flow chart of a simulation method for the circuit characteristic of a semiconductor device.

Various embodiments of the present invention will be described with reference to the accompanying drawings. It is to be noted that the same or similar reference numerals are applied to the same Or similar parts and elements throughout the drawings, and the description of the same or similar parts and elements will be omitted or simplified.

The present inventor sought for the cause of the estimated device characteristic and circuit characteristic not coinciding with actually measured values of the semiconductor device. That is, the reason for estimated device characteristic and circuit characteristic that are possible in simulation not bring found in practice will be clarified.

The present inventor considers that the reason these values do not coincide lies in the accuracy of worst-case analysis on the device characteristic being low, and compares these results with Monte Carlo analysis, which is capable of calculating distribution characteristics due to process fluctuation of the device characteristic at high accuracy. The "worst-case" mentioned here refers to a case in which maximum fluctuation in manufacturing process occurs.

FIG. 1 shows a flow chart of the simulation method for the circuit characteristic of a semiconductor device used to search for the cause. First, us shown in step S11, a fluctuation width of manufacturing process of the semiconductor device is input. Next, in step S12, worst-case analysis on the process fluctuation is carried out. In this analysis, the fluctuation width of the electric characteristic of each device composing the semiconductor device is obtained. Next, in step S13, the worst-case analysis on an electric circuit in the semiconductor is carried out based on the fluctuation width of the electric characteristic of the device. From this analysis, the circuit characteristic of the semiconductor device is obtained.

Because main steam semiconductor devices today, such as LSI, are complementary metal oxide semiconductor field effect transistors (CMOSFET), these CMOSFET will be described here. The CMOSFET is a technology for constructing a circuit by complementarily combining an n-type MOS field effect transistor (nFET) with a p-type MOS field effect transistor (pFET). Therefore, the LSI circuit is constructed from the n-type FET and the p-type FET as its basic devices, so that they are integrated with each other. As evident from this fact, the cause of the circuit characteristic fluctuation is the device characteristic (electric characteristic of the n type FET and the p type FET) fluctuation. Further, the cause of the device characteristic fluctuation is that process fluctuations (fluctuation or process parameter) are produced in the p type FET and the p type FET during manufacturing. The device characteristic mentioned here refers to the electric characteristics of the n type FET and the p type FET, for example, the threshold voltage or saturated current value. The circuit characteristics refer to so-called the circuit specification, for example, propagation delay time of circuit, access time, frequency, power consumption and the like The n type FET and p type FET of FIG. 2 each contain a silicon substrate 31. The silicon substrate 31 includes a source region 33 and a drain region 34, which is located separate from the source region 33 but so that both of them include the surface of the Silicon substrate 31. Further, the silicon substrate 31 includes a channel region 32 between the regions 33 and 34. A gate insulation film 35 is provided on the silicon substrate 31 A gate electrode 36 is provided above the channel region 32 on the gate insulation film 35.

Figures 2, 3:
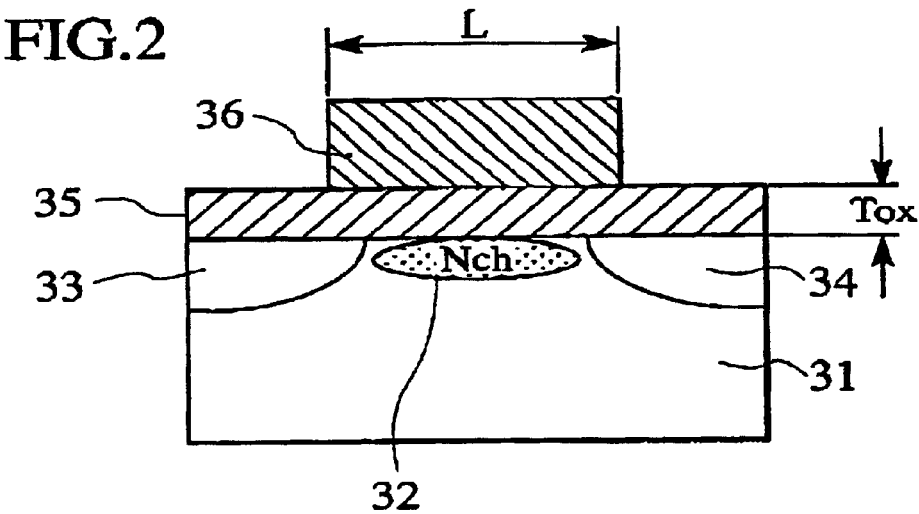
FIG. 2 is a diagram for explaining a device structure parameter, which undergoes process fluctuation in the MOSFET (semiconductor device)
FIG. 3 is a table for specifying the process fluctuation of the device structure parameter in each case of the worst-case analysis.

There are three important device structure parameters for determining the device characteristic in the n type FET and the p type FET shown in FIG. 2, namely, gate length (L), gate oxide film thickness (Tox) and channel impurity concentration (Nch). Then, in step S11, as the fluctuation width of process, fluctuation width ($\Delta L$) of gate length (L), fluctuation width ($\Delta Tox$) of gate oxide film thickness (Tox) and fluctuation width ($\Delta Nch$) of channel impurity concentration (Nch) are input.

Next, in step S12, worst-case analysis of the process fluctuation is carried out. Through the worst-case analysis, circuit characteristic fluctuation caused by the process fluctuation can be estimated. The basic concept of the worst-case analysis, is that the worst case of the process analysis provides the worst case of the device characteristics. And the worst case of the device characteristics provides the worst case of the circuit characteristic. Fluctuations in the device characteristics and circuit characteristics are estimated First, the worse case of the process fluctuation is obtained, The worst case of the process fluctuation can be generated by combining the minimum value and the maximum value of each parameter P(L, Tox, Nch). Generally, the fluctuation of the process parameter indicates Gaussian distribution horizontally symmetrical to a nominal value (a process parameter value when the fluctuation amount is zero). If the nominal value in the Gaussian distribution concerning process parameter P is P0, standard deviation is $\sigma$, according to the principle of $3\sigma$ in statistics, and the probability that the fluctuation of the process parameter P falls within $P0\pm3\sigma$ is 99.7%. Therefore, it may be considered that the minimum value of the process parameter is $P0\pm3\sigma$ and the maximum value is $P0+3\sigma$. Then, in the worst case analysis, fluctuation amounts $+3\sigma$ and $-3\sigma$ are used as the maximum value and minimum value of each process fluctuation. That is, if the nominal value and standard deviation in Gaussian distribution of each of the gate length (L), gate oxide film thickness (Tox) and channel impurity concentration (Nch) are (L0, $\sigma_L$), (t0, $\sigma_r$), (N0, $\sigma_N$), the minimum value and maximum value of each process parameter are (L0$-3\sigma_L$, L0$+3\sigma_L$), (т0$-3\sigma_T$, T0$+3\sigma_T$), (N0$-3\sigma_N$, N0$+3\sigma_N$)

The two process fluctuation amounts $\Delta L$ and $\Delta Tox$ are the same as the fluctuation amount in the n type FET and p-type FET in the same chip. However, the fluctuation amount $\Delta Nch$ has a completely independent fluctuation amount to each of the other n-type FET and the p-type FET despite being part of the same chip. That is, in the CMOS circuit, channel impurity concentration fluctuation of the n type FET ($\Delta Nch$ (n type FET)) and channel impurity concentration fluctuation of the p type FET ($\Delta Nch$ (p type FET)) need to be handled independently of each other. Thus, the process fluctuations which should be considered in order to estimate the circuit characteristic fluctuation comprise four types of the fluctuations, namely, $\Delta L$, $\Delta Tox$, $\Delta Nch$ (nFET) and $\Delta Nch$ (pFET).

In the worst-case analysis, as shown in FIG. 3, the device characteristic and the circuit characteristic are calculated for a total of 16 cases ($2^4=16$) in which the maximum value (+) and minimum value (−) of each process fluctuation of four types Then, the worst case is selected from the 16 cases. More specifically, a process fluctuation shown in FIG. 3 (case 1–16) is given to nominal spice model (input parameter set for use in circuit simulation) corresponding to nominal condition. That is, by adding a fluctuation amount $\Delta P$ to the nominal spice parameter P0, namely $P=P0+\Delta P$, a new corner spice model P is generated Consequently, 16 corner spice models are generated, and then simulations of the device characteristics and circuit characteristics can be executed for each of the 16.

A result of the worst-case analysis on the device characteristic is compared with Monte Carlo analysis capable of calculating the distribution characteristic of the device characteristic by process deviation at a high accuracy.

Figure 4:
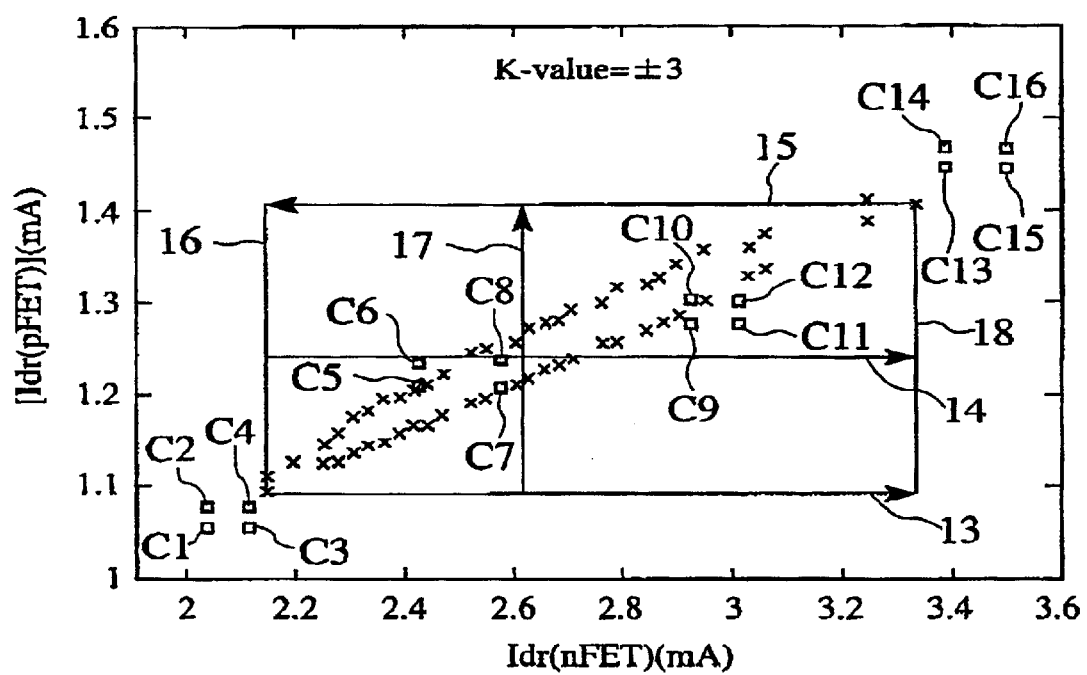
FIG. 4 is the results of a calculation of the drive current (Idr) of CMOSFET (n type FET and p type FET) according to worst-case analysis in which the fluctuation width (K value) of the device structure parameter is 3.

FIG. 4 indicates with a square where each case shown in FIG. 3 is located on an Idr distribution diagram of the device characteristic. Its abscissa (x−) axis indicates the drive current (Idr (n type FET)) of the n type FET while the ordinate (y−) axis indicates the absolute value (|Idr (p type FET)|) of the drive current of the pFET. FIG. 4 shows a case where all + in FIG. 3 are fluctuation width of $+3\sigma$ while all − indicates fluctuation width of $-3\sigma$.

As a reference for the worst-case analysis, the strictly defined Idr distribution diagram obtained from a circuit simulation by Monte Carlo analysis is indicated by the ellipse formed by connecting symbols X. According to Monte Carlo analysis, the Idr value can not obtain any other value than values within this ellipse. The ellipse of Xs rising in a rightward direction as a periphery to the distribution diagram is obtained by the four process fluctuations ($\Delta L$, ΔTox, ΔNch (nfet)) each being provided with independent Gaussian distribution and then the Monte Carlo calculation being executed 2,000 times by circuit simulation. Because the Idr distribution diagram indicates the ellipse rising in the rightward direction, it is found that there is a strong correlation between Idr (nfet) and |Idr(pfet)|. Further, cross-like arrows 14, 17 located slightly lower and left of the center of the ellipse in each diagram denote the nominal value (vertical arrow 17) of Idr (nfet) and the nominal value (lateral arrow 14) of |Idr (pfet)|.

The reason why the worst-case analysis is executed although the fluctuation width of the circuit characteristic can be found just by executing Monte Carlo analysis is that the analysis time of Monte Carlo analysis is very long. Because a relatively small circuit (smaller than several thousand devices) dose not require so long a simulation time, it is permissible to obtain its fluctuation values directly by using Monte Carlo analysis on the circuit characteristic. However, in the case of a large-scale circuit (several thousand-several ten thousand devices), because a single simulation time may sometimes take several hours, application of the Monte Carlo analysis for example 2000 times is not practical in view of calculation efficiency. This amount of analysis time would be fatal to the development of a semiconductor in which development speed is demanded, and therefore, Monte Carlo analysis cannot be applied.

On comparison of both the analysis results, it is made evident that some of the squares which indicate the results of the worst-case analysis are largely deviated from the: strictly defend elliptical Idr distribution diagram based on Monte Carlo analysis. The existence of these deflected squares is a fatal problem for the worst-case analysis. Thai is, by right the process fluctuation should have a fluctuation width of ±3σ with respect to each process parameter. However, the probability that the absolute values of respective: process parameters become 3σ at the same time is very low, and in practice such a case hardly ever occurs. Thus, in the worst-case analysis shown in FIG. 4, an excessive (over-estimated) estimation result is obtained. This is because worst-case analysis does not fit practical situations.

Finally, in step S13, from the excessive estimation result, a corresponding corner spice model is obtained, and then using that corner spice model the worst case of the circuit characteristic is estimated. In this case, the excessive estimation result of the device characteristic produces an excessive estimation result of the circuit characteristic. The estimation accuracy of the circuit characteristic is not assured at all. This is a problem with the worst-case analysis. That is, the worst-case analysis is not capable of estimating at high accuracy the device characteristic due to a process fluctuation and a fluctuation of the circuit characteristic.

(Organization of a Simulator for the Circuit Characteristics of a Semiconductor Device)

Figure 5:
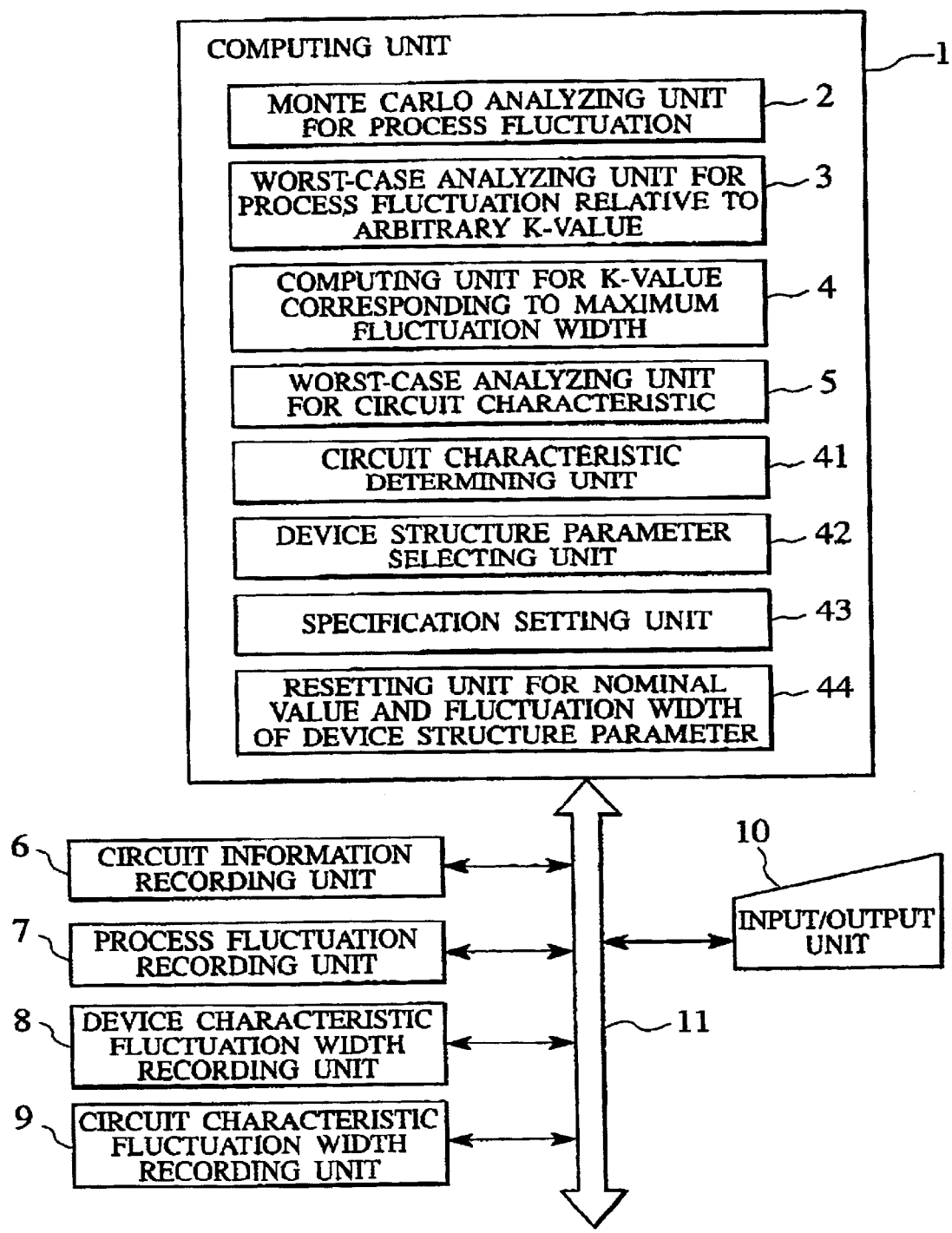
FIG. 5 is a structural diagram of a simulator for the circuit characteristic of the semiconductor device.

FIG. 5 is an organization of a simulator for the circuit characteristics of a semiconductor device according to this embodiment. The simulator for the circuit characteristic of the semiconductor encompasses a computing unit 1, recording units 6 to 9, and input/output unit 10. The computing unit 17 the recording units 6 to 9 and the input/output unit 10 are connected Lo each other through a bus 11. The computing unit 1 includes a process fluctuation Monte Carlo analyzing unit 2, a worst-case analyzing unit 3 for process fluctuation to arbitrary K-value, a computing unit 4 for K-value corresponding to maximum fluctuation width, a worst-case analyzing unit 5 for circuit characteristic, a circuit characteristic determining unit 41, a process parameter selecting unit 42, a specification setting unit 43 for device characteristic and circuit characteristic and a resetting unit 44 for nominal value and fluctuation width of device structure parameter. The recording units 6 to 9 include a circuit information recording unit 6, a process fluctuation width recording unit 7, a device characteristic fluctuation width recording unit 8, and 4 circuit characteristic fluctuation width recording unit 9.

(Simulation Method for the Circuit Characteristic of Semiconductor Device)

Figure 6:
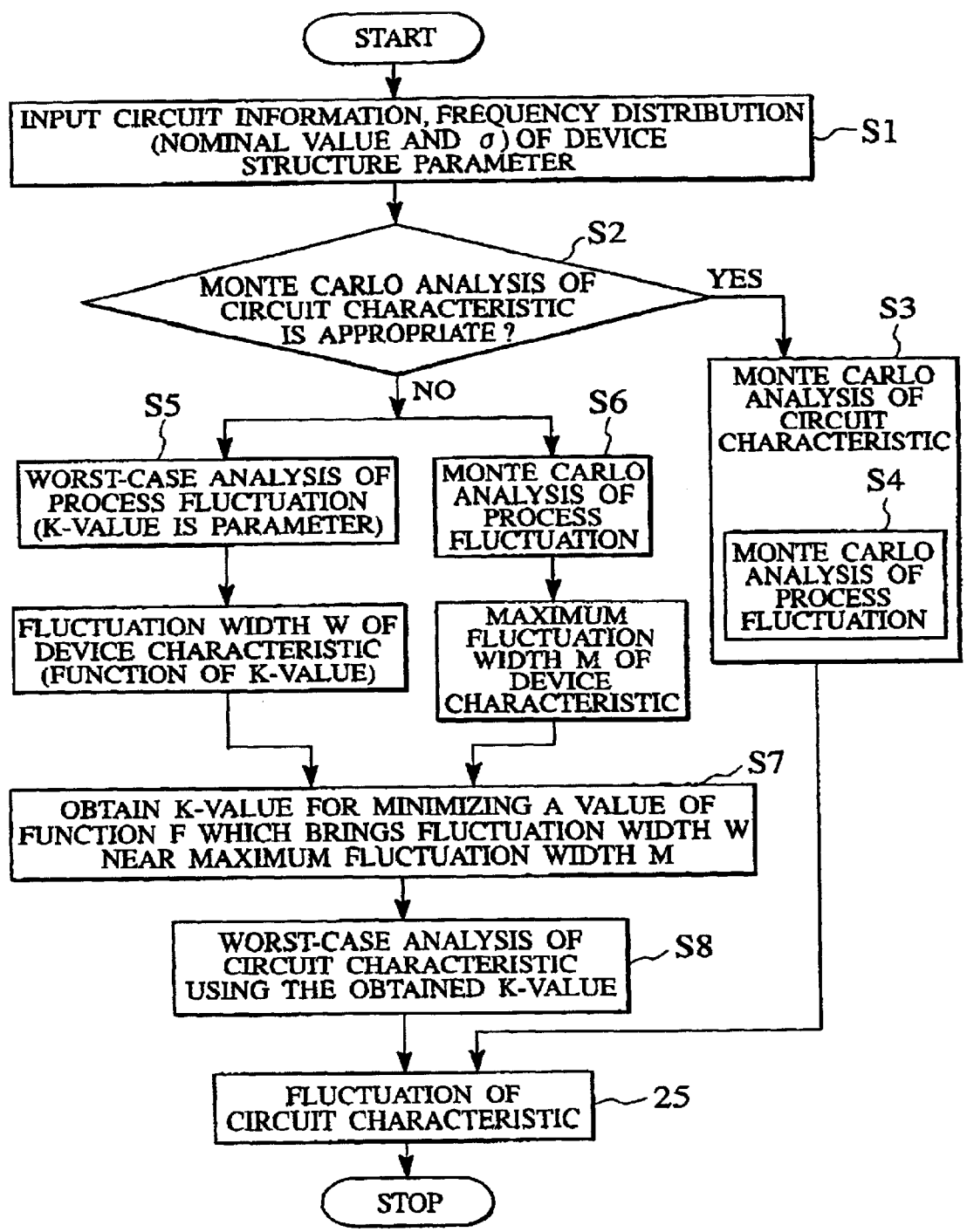
FIG. 6 is a flow chart of the simulation method for the circuit characteristic of the semiconductor device.

FIG. 6 is a flow chart of a simulation method using the simulator about the circuit characteristic of the semiconductor device according to this embodiment.

First, in step S1, wiring information of the semiconductor device and circuit information about circuit size such as the quantity of the FETs are input through the input/output unit 10 and recorded in the circuit information recording unit 6 as circuit information. Further, as proven frequency distribution values, the parameter of the device structure such as the FET is input through the input/output unit 10 If this frequency distribution is recognized to be Gaussian distribution, tho nominal value and the standard deviation σ are input. This frequency distribution is recorded in the process fluctuation width recording unit 7. For the process fluctuation width, fluctuation width (ΔL) of gate length (L), fluctuation width (ΔTox) of gate oxide film thickness, and fluctuation width (ΔNch) of channel impurity concentration (Nch) are used.

Meanwhile, the frequency distribution of the device structure parameter about the gate length (L), gate oxide film thickness (Tox) and channel impurity concentration (Nch) are regarded us Gaussian distribution. Thus, the fluctuation width from each nominal value of the device structure parameter can be expressed such that the standard deviation σ is a unit. The fluctuation width expressed such that the standard deviation σ is a unit is called K-value. Then, if the fluctuation width of each device structure parameter is converted to a K-value, the procedure after step S5 can be easily executed. Thus, each fluctuation width of plural device structure parameters can be expressed as a K-value. Meanwhile, the K-value may be different depending on the device structure parameter. For example, the K-value may be bet to be the same value or a different value where it increases from the nominal value or decreases from the nominal value, corresponding to the characteristic of the process. Likewise, the same K-value may be set up as the gate length (L), gate oxide film thickness (Tox) and channel impurity concentration (Nch) or different K-values may be set up. If different K-values are set up, they are handled so that they can be distinguished from each other.

Next, in step S2, it is determined whether or not Monte Carlo analysis of the circuit characteristic of the semiconductor device is appropriate. If possible, the Monte Carlo analysis on the circuit characteristic in step S3 is carried out. The criterion for determination is that time required for Monte Carlo analysis on the circuit characteristic should not be too long. More specifically, the circuit size of the FET or the like composing the circuit acts as the criterion for determination. In step 3, the Monte Carlo analysis of the circuit characteristics, and in step S4, the Monte Carlo analysis of process fluctuation on individual devices such as the FETs composing the circuit are carried out. In step S4, the Monte Carlo analysis of the process fluctuation is carried out in the Monte Carlo analyzing unit 2 for process fluctuation shown in FIG. 5. In this analysis, the fluctuation of the circuit characteristic is obtained, and then the simulation method is complete.

If it is determined in step S2 that the Monte Carlo analysis of the circuit characteristic is inappropriate, steps S5, S6 are carried out. Although the time necessary for this simulation can be reduced by executing both steps in parallel, it is possible to execute either of them ahead of the other.

In step S5, the worst-case analysis of the process fluctuation with K-value as a variable is carried out on devices by the worst case analyzing unit 3 for process fluctuation corresponding to arbitrary K value of FIG. 5. The circuit of the semiconductor uses plural devices such as the FETs Because only the same result can be obtained even if process fluctuation analysis is carried out for the same structure device, the analysis is carried out once for each different structure. For example, if the nFETs and pFETs in the circuit are all of the same structure, the analysis on the nFET and pFET only has to be carried out once for each.

Figure 7:
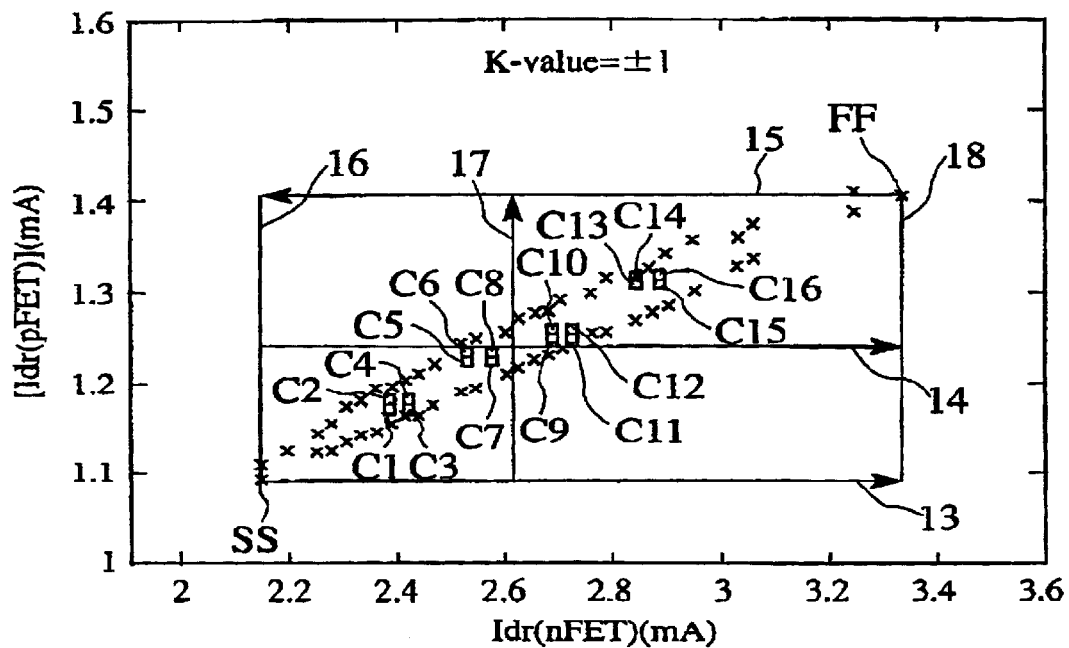
FIG. 7 is the results of at calculation of the drive current (Idr) of CMOSFET by according to worst-case analysis in which the fluctuation width (K value) of the device structure parameter is 1.
Figure 8:
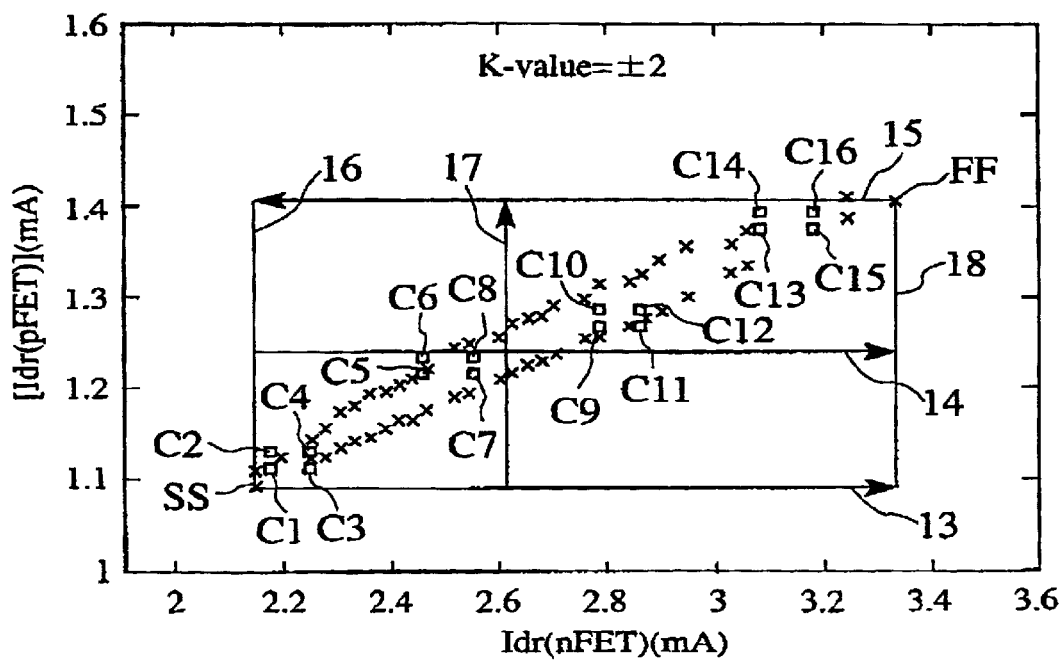
FIG. 8 is the results of a calculation of the drive current (Idr) of CMOSFET according to worst-case analysis in which the fluctuation width (K value) of the device structure parameter is 2.

FIGS. 7 and 8 show the results of a calculation of driving current Idr corresponding to process fluctuation by changing the fluctuation amount width (changing the K-value) by carrying out worst-case analysis of the NFET and pFET FIG. 7 shows a case where the K-value is ±1, so that the fluctuation width of gate: length (ΔL), the fluctuation width of gate oxide thickness (ΔTox), and channel impurity concentration fluctuation width (ΔNch) are set to the same K value ±1. Further, the fluctuation width from the nominal value in a positive direction and in a negative direction is set as equal for the K value ±1 and the K value −1. On the other hand, FIG. 8 indicates a case where the K value is ±2. FIG. 4 described previously indicates a case where the K value is ±3.

In FIG. 3, the location of the respective cases 1 to 16 on the Idr distribution diagram as device characteristics are indicated by tho corresponding squares. The case Nos. 1 to 16 correspond to C1 to C16 in FIGS. 4, 7 and 8. The abscissa (x) axis in each of FIGS. 4, 7 and 8 indicates an absolute value (Idr(nFET)) of a drive current corresponding to nFET, while the ordinate (y) axis thereof indicates an absolute value (|Idr(pFET)|) of the drive current corresponding to pFET. Because the intersection of arrows 14 and 17 provides a drive current with no process fluctuation, the square most distanced from this intersection provides the worst case. From this, it is found that when the K value is ±1, case C1 and C16 are the worst cases. Even when the K value is ±2 in FIG. 8 and ±3 in FIG. 4, cases C1 and C16 are the worst cases.

The fluctuation width W of the device characteristic refers to the distance between the intersection of arrows 14 and 17 and case 1 or 16, or the distance on the graph plane of FIGS. 4, 7 and 8. The driving current of the worst cases C1, C16 and the fluctuation width W of the device characteristic are recorded in the device characteristic fluctuation width recording unit 8 of FIG. 5. These are compared to FIGS. 4, 7 and 8. In case C1, it is found that Idr(nFET) and |Idr (pFET)| decrease as the K value changes to −1, −2, −3. About the case C16, it also found that Idr(nFET) and |Idr(pFET)| increase as the K value changes to 1, 2, 3.

Figure 9:
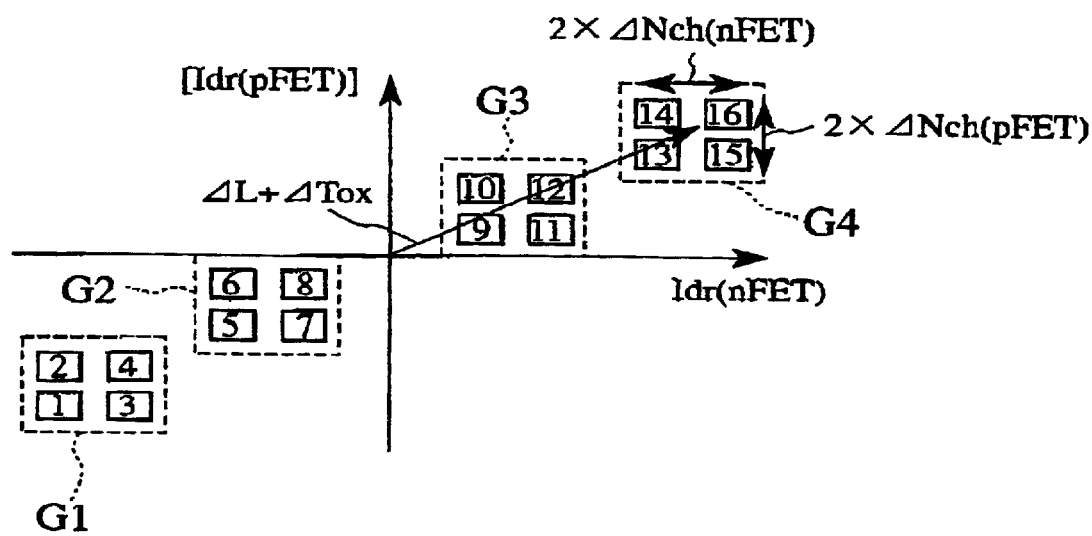
FIG. 9 is a diagram showing the influence of the device structure parameter on the drive current (Idr) of the CMOSFET calculated by worst-case analysis.

FIG. 9 is a diagram showing the relationship between the driving current of each case, as calculated by worst case analysis of the process fluctuation in CMOSFET and the fluctuation amount of each process fluctuation The disposition position of each case is a point which can be controlled depending on the size of a process fluctuation (ΔL, ΔTox, ΔNch (nFET), ΔNch(pFET)). The 16 cases C1 to C16 are divided into four groups G1 to G4. For example, the group G4 is composed of the four cases C13 to C16 and the disposition positions of these four cases C13 to C16 allow a rectangle to be formed with these disposition positions as corners. The positions of groups G1 to G4 are determined by the sum (ΔL+ΔTox) of the fluctuation amounts of ΔL and ΔTow. The degree of spreading of the four cases in each of the tour groups in the direction of Idr(nFET) is determined by twice ΔNch (nFET). The degree of spreading in the direction of |Idr(pFET)| is determined by twice ΔNch (pFET). From these, it is found that the fluctuation amount of Idr by the process fluctuation of ΔL and ΔTox is larger than the fluctuation amount of Idr by the process fluctuation of ΔNch (nFET) and ΔNch (pFET). The reason enabling the comparison of the size of the fluctuation amount of the device characteristic in relation to the fluctuation amount is the transformation of the fluctuation amount is to at K-value, which is a standard value.

As for the CMOSFET, it can be easily found that the worst cases are C1, C16 from such a graph as FIG. 7. If the worst case is automatically determined, it is necessary to calculate the distance from an intersection between the nominal values 14 and 17 for all the cases C1 to C16, so as to select the maximum value for this distance. However, the distances for all the cases do not always have to be calculated. That is, in addition to the distance from the intersection between the nominal value of the case C1 and that of the case C16, ½ a distance from the position of the case C6 up to the position of C11, ½ a difference of the Idr(nFET) values between the case C6 and case C11 are to be chosen for the maximum value. The same thing can be said for case C7, C10. Thus, it is possible to reduce the number of choices.

Figure 10:
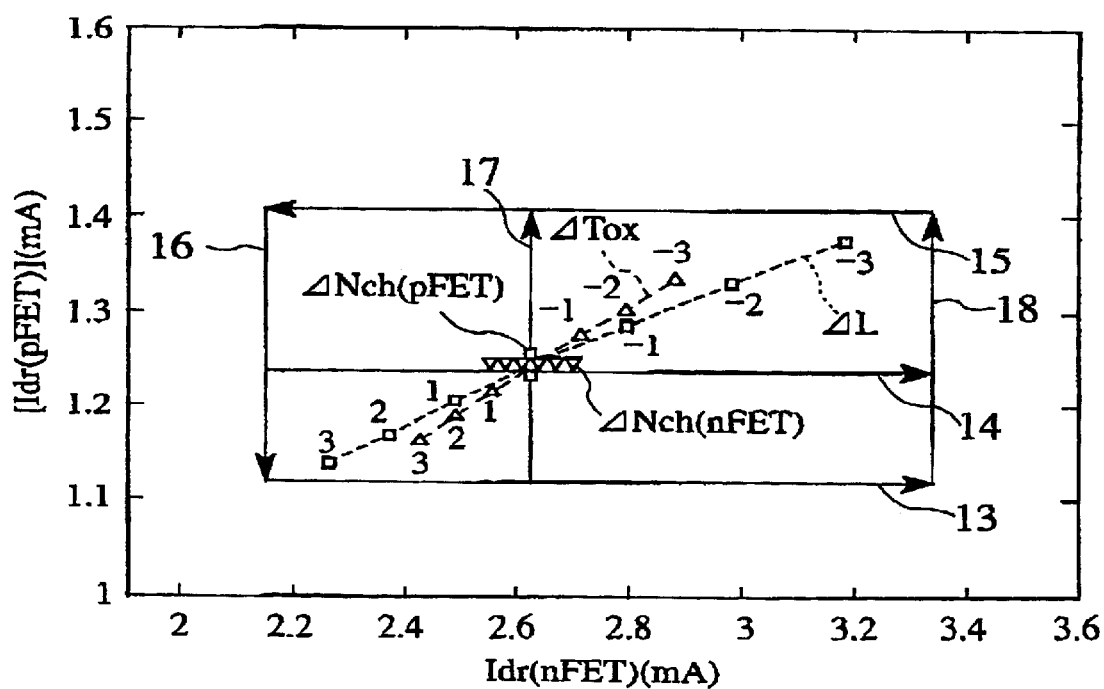
FIG. 10 is a diagram showing the drive current (Idr) of the CMOSFET where the device structure parameter is fluctuated in a range from $-3\sigma$ to $+3\sigma$.
Figure 11:
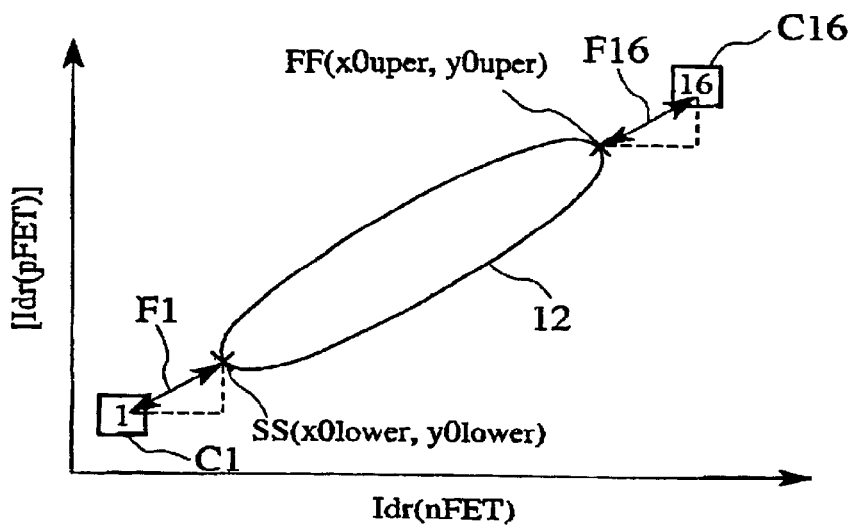
FIGS. 11 and 12 are diagrams for explaining optimization method for the fluctuation width (K value), which matches the results of the worst-case analysis with the results of Monte Carlo analysis.

FIG. 10 is a diagram showing the relationship between each process fluctuation and fluctuation amount of the driving current in the CMOSFET. This shows the values of Idr which change when each process fluctuation (ΔL, ΔTox, ΔNch(nFET), ΔNch(pFET)) is fluctuated to −2, −2, −1, 0, +1, +2, +3 by the K value. For example, when fluctuating the ΔL, other process fluctuation than ΔL is set to zero. The larger the absolute value of the K value, the farther the value of Idr upon the process fluctuation moves from the nominal value. It is found that the fluctuation of ΔL contributes to the fluctuation of Idr most largely, followed by the ΔTox. The ΔNch(nFET) and ΔNch(pFET) contribute to fluctuation only of Idr(nFET) and only Idr(pFET). Although the fluctuations of ΔL and ΔTox contribute to the fluctuations of Idr(nFET) and Idr(pFET), they hardly contribute to the fluctuations of ΔNch(nFET) and ΔNch(pFET). Consequently, by obtaining the fluctuations of Idr(nFET) and Idr(pFET) without considering the fluctuations of ΔNch(nFET) and ΔNch(pFET), the fluctuations of the device characteristic and circuit characteristic can be estimated more quickly while maintaining high accuracy In step S6 of FIG. 6, Monte Carlo analysis of process fluctuation is carried out on a device having the same structure as the device subjected to analysis in step S5, by the Monte Carlo analyzing unit 2 for the process fluctuation. In FIGS. 4, 7 and 8, the same results calculated by Monte Carlo analysis on a driving current corresponding to the process fluctuation in the CMOSFET are expressed with a cross symbol. The reason the representation is repeated in the respective diagrams is as a reference for the worst-case analysis.

The strict Idr distribution diagram obtained from Monte Carlo circuit simulation is indicated by an ellipse drawn with cross symbols. That is, 54 cross symbols disposed in the shape of an ellipse rising in the rightward direction of each diagram are located on the outermost periphery of a distribution diagram of 2,000 cross symbols obtained by providing four kinds of process fluctuations (ΔL, ΔTox, ΔNch (nfet), ΔNch(pfet)) each with independent Gaussian distributions, and then executing a Monte Carlo calculation 2,000 times based on a circuit simulation.

Because the Idr distribution diagram indicates an ellipse rising in the rightward direction, it is evident that there is a strong correlation between Idr (nFET) and |Idr (pFET)|. The arrows 14 and 17 located slightly below and leftward of the center of the ellipse of each diagram denote a nominal value (vertical arrow 17) of Idr (nFET) and a nominal value (lateral arrow 14) of |Idr (pFET)|. Meanwhile, the arrows 16 and 18 indicate a minimum value and a maximum value of |Idr (pFET)|.

Because the intersection of the arrows 14 and 17 provides a drive current where there is no process fluctuation, the crows symbol most distanced from this intersection provides the maximum fluctuation width M of the device characteristic. Consequently, it is evident that the cross symbols, which provide the maximum fluctuation width M are cross symbols SS, FF. The maximum fluctuation width M of the device characteristic refers to the distance on the graph plane between the cross symbols SS and FF.

In FIGS. 4, 7 and 8, the disposition positions of the cases C1, C2 which are the worst a cases with respect to the disposition positions of the cross symbols SS, FF change depending on the K value. If the distance from the intersection of the arrows 14 and 17 is regarded as a reference point, when the K value is ±1 or ±2, the distance from cases C1 and C16 to the intersection is shorter than the distance from the cross symbols SS, FF to the intersection. On the other hand, if the K value is ±3, the distance from cases C1, C16 to the intersection is longer than the distance from cross symbols SS, FF to the intersection Consequently, by setting the K value at a specific value located between +2 and +3 and a specific value located between −2 and −3, it is possible to match or dispose the disposition positions of the cases C1, C2, which are the worst cases, with the disposition positions of the cross symbols SS, FF or in the vicinity thereof.

Then, the K value is optimized so that the position of the worst case coincides with the edge of a proper Idr distribution diagram (elliptic). The optimization of the K value mentioned here denotes optimizing the value of a parameter K when the maximum fluctuation amount is expressed as (maximum fluctuation amount)=±K σ. It does not denote optimizing σ itself. As shown in step S7 of FIG. 6, the fluctuation width W in the worst case is brought near the maximum fluctuation width M in Monte Carlo analysis by changing the K value. That is, a K value which minimize the value of a function F is obtained. For this, the fact that positions on the graph of cases C1 to C16 in the worst case analysis can he controlled by changing the size of the process fluctuations (ΔL, ΔTox, ΔNch(nFET), ΔNch (pFET))(by changing the K value) is employed.

More specifically, the positions of the cases C1, C16, which are the worst cases, on the Idr distribution diagram are matched with the positions of the cross symbol SS (x0lower, y0lower) and the cross symbol FF (x0upper, y0upper) on the strictly defined Idr distribution diagram obtained by Monte Carlo analysis. Meanwhile, although the values of x0lower and x0upper are values of Idr(nFET), the Idr(nFET) value may be standardized on a scale in which the distribution is in a unit with the nominal value as zero. The values of y0lower and y0upper may be standardized also. Thus, the above-described alignment can be carried out in circuit characteristics having different unit systems and the like. Then, function F defined in the Eq. (1) is introduced to carry out the matching.

$$F=[(x-x0)^2+(y-y0)^2]^{1/2} \quad (1)$$

In the Eq. (1), x and y denote positions (Idr value), (x,y) on the Idr distribution diagram of the case C1 or C16, which is the worst case. X and y are expressed as function of the K value. On the other hand, x0 is general expression of x0lower and x0upper and y0 is general expression of y0lower and y0upper. As for the function F, the function F1 expressed by the Eq. (2) denotes the distance between the case C1 and the cross symbol SS on the Idr distribution diagram. Likewise, the function F16 expressed by the Eq. (3) denotes the distance between the case C16 and the cross symbol FF on the Idr distribution diagram. Consequently, the parameter K value which minimizes the values of the functions F1, F16 to carry out the matching is obtained. For simplification here, the K values of the fluctuation values of the device structure parameters of four kinds are moved in uniform.

$$F1=[(x1-x0lower)^2+(y1-y0lower)^2]^{1/2} \quad (2)$$

$$F16=[(x16-x0upper)^2+(y16-y0upper)^2]^{1/2} \quad (3)$$

With the abscissa axis as an absolute value of the K value and the ordinate axis as the function F, the sum of the functions F1 and F16 and the sum of the functions F1 and F16 (F1+F16) are shown. Consequently, it is evident that the function F1 is minimized when the absolute value of the K value is 2.19. The function F16 is minimized when the absolute value of the K value is 2.43. The sum of the functions F1 and F16 (F1+F16) is minimized when the absolute value of the K value is 2.375. The purpose for evaluation of the sum of the functions F1 and F16 (F1+F16) is to find out a single K value which reduces both the functions F1 and F16 of the C1 and C16, which are two poles of the worst cases. Hereinafter, this K value of 2.375 is called "K value after optimization". As the K value after optimization, it is possible to use the average of the absolute value of the K value which is minimized under the function F1 and the K value which is minimized under the function F16. Further, because the absolute value of the K value which is minimized under the function F1 is larger than the absolute value of the K value which is minimized under the function F16, it is possible to consider that case C16 is a worse case than case C1, and employ the absolute value of the K value which is minimized under the function F16 as the absolute value 2.43 of the K value after optimization.

Figure 12:
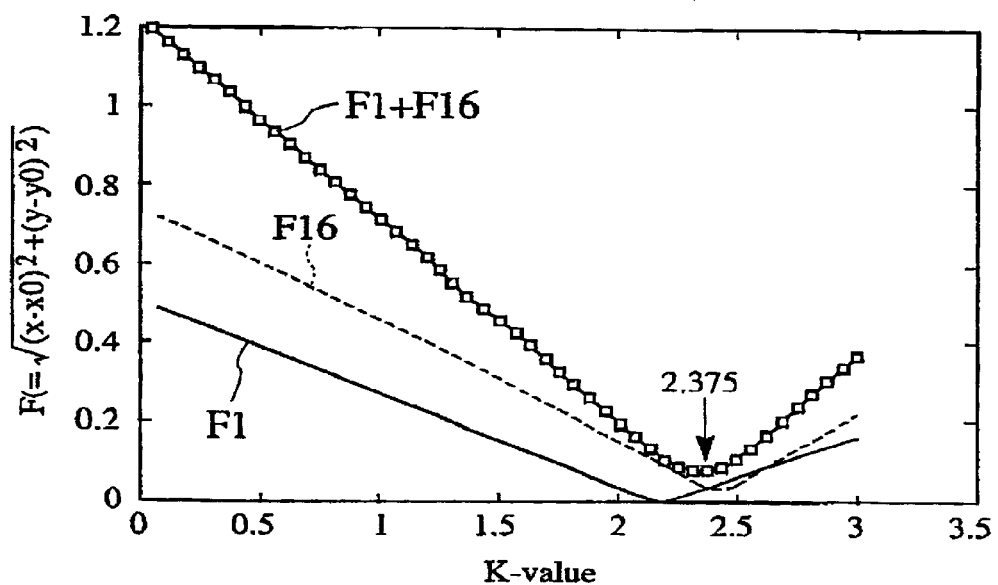
Figure 13:
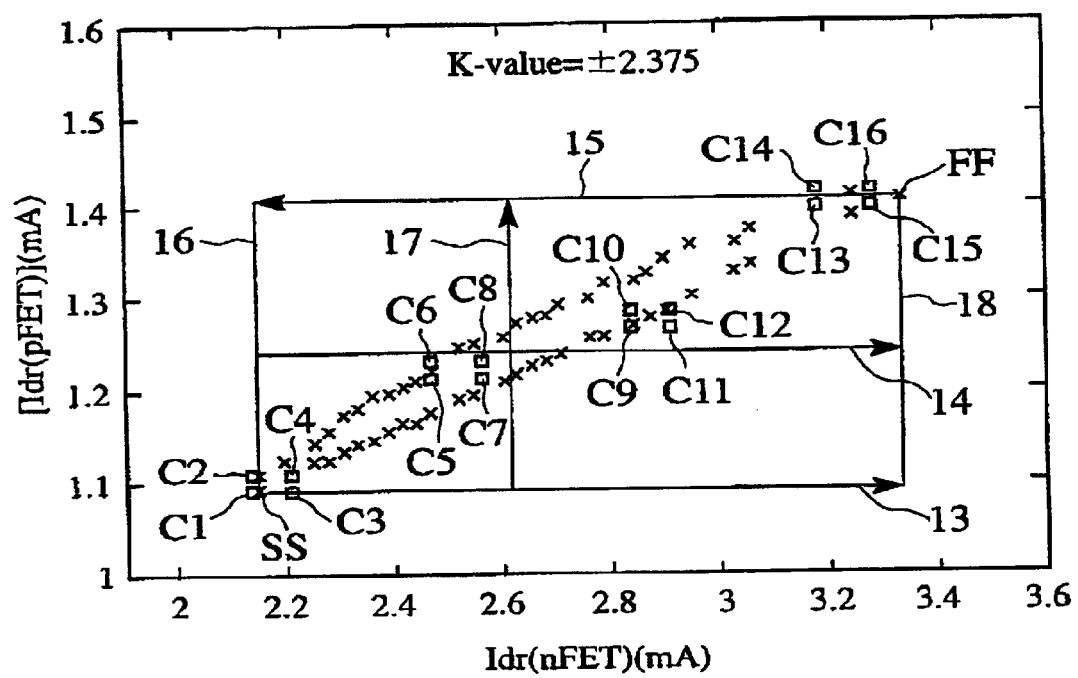
FIG. 13 is the results of a calculation of the drive current (Idr) of the CMOSFET according to the worst-case analysis in which the K value of the device structure parameter is an optimized 2.375.

FIG. 13 shows the results of obtaining the positions of the cases C1 to C16 on the Idr distribution diagram by worst-case analysis using a K value of 2.375 as the K value after optimization. In FIG. 13, the K values of the four kinds of process fluctuations are uniformly ±2.375, as in FIG. 12. Using Monte Carlo circuit simulation, the edge of the strictly defined elliptic Idr distribution diagram can be well matched with the positions of the cases in the worst-case analysis.

In summary, in step S6 of FIG. 6, the strict Idr distribution diagram of device characteristic fluctuation is obtained by Monte Carlo circuit simulation (Monte Carlo device simulation may also be used). The Monte Carlo analysis mentioned here is applied to the device characteristic of a single MOS transistor. Thus, particularly, in circuit simulation, a fall in computation efficiency, which is ordinarily problematic to Monte Carlo calculation, does not have to be a cause of concern. Next, in step S5, the worst-case analysis is carried out on the device characteristic of the single MOS transistor. The analysis result is recorded in the fluctuation width recording unit 8 of the device characteristic of FIG. 5. Then, by matching the results of the worst case analysis with the results of the Monte Carlo analysis as shown in FIG. 12 using the K-value computing unit 4 corresponding to a maximum fluctuation width of FIG. 5, optimization of the K value in the worst-case analysis is carried out, so that the K value after optimization is obtained.

In step S8 of FIG. 6, the processing step advances by the worst-case analysis of the circuit characteristics of FIG. 5 being carried out by the worst-case analyzing unit 5, so as to obtain a fluctuation 25 in the circuit characteristics. This analysis result is recorded in the fluctuation width recording unit 9. In this case, using the "σvalue after optimization" already obtained from the fluctuation analysis of the device characteristic, the fluctuation 25 of the circuit characteristic of a large scale circuit can be estimated quickly at high accuracy.

Figure 14:
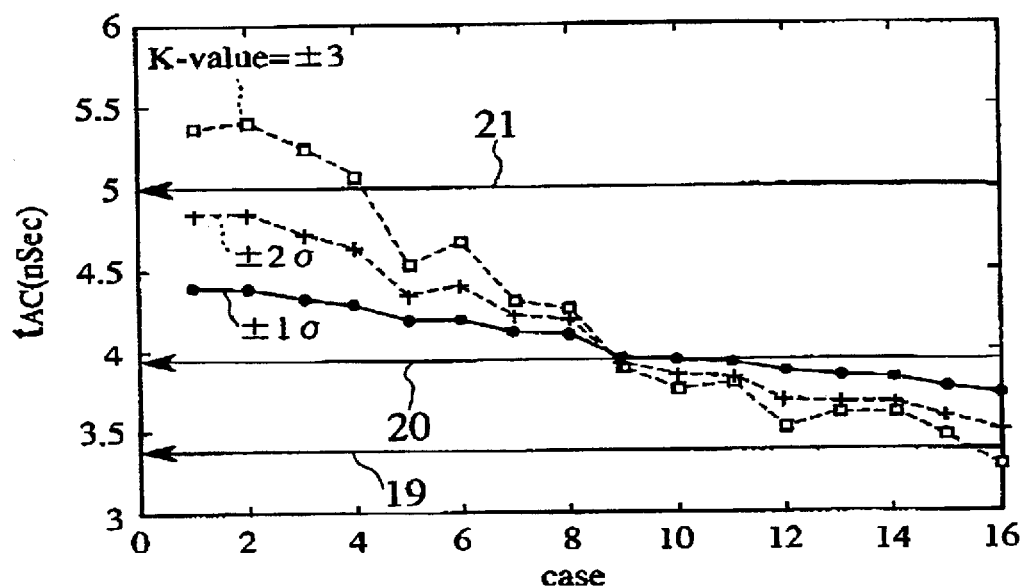
FIG. 14 shows the circuit characteristic (access time) of each case calculated based on the worst-case analysis of the device structure parameter where the fluctuation amount width (K value) is constant.

The estimation result of the fluctuation 25 of the circuit characteristic will be described with reference to FIGS. 14 and 15. FIG. 14 shows the behavior of access time ($t_{AC}$) as the circuit characteristic. This figure shows values of access times to the cases C1–C16 when the K value in the worst case analysis is ±1, ±2, ±3. A maximum value (a horizontal arrow 21 of about 5 [ns]) of access time obtained by strict Monte Carlo analysis, a nominal value (a horizontal arrow 20 of about 3.9 [ns]) and a minimum value (a horizontal arrow 19 of about 3.4 [ns]) are indicated on the ordinate axis. Consequently, it is evident that when the K value is ±3σ the maximum value of access time in the case C1 to C16 is over-estimated, while the minimum value of access time in the case C16 is under-estimated. When the K value is ±1, ±2, the maximum fluctuation width from the nominal value is smaller than the maximum fluctuation width obtained by Monte Carlo analysis This denotes that in order to estimate the fluctuation (maximum value and minimum value) of the access time as a circuit characteristic accurately according to the worst-case analysis, a K value or the like, whose absolute value is in a range of 2 or more to less than 3, must be used. This coincides with the results obtained in step S7.

Figure 15:
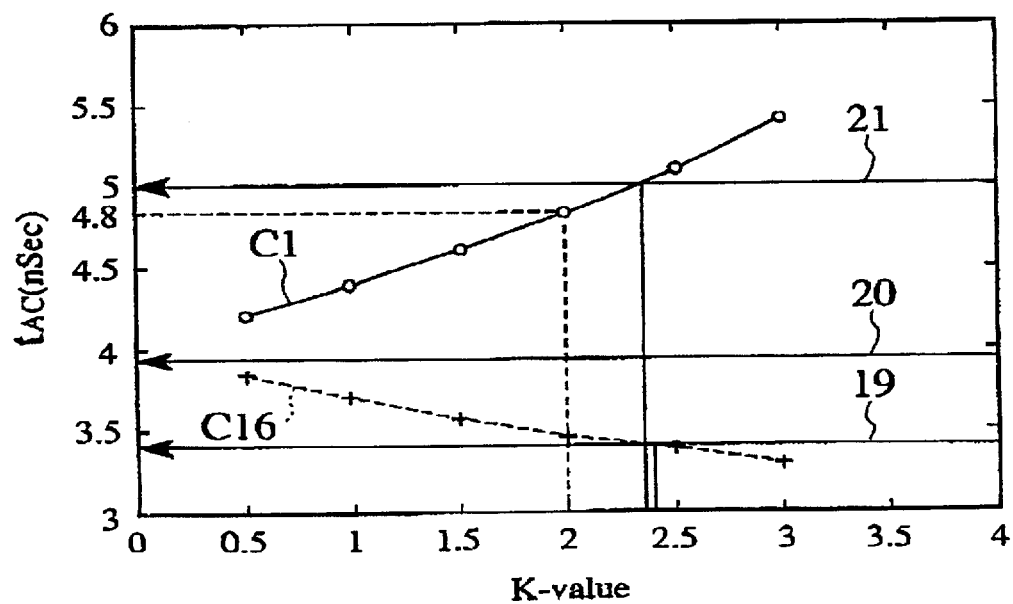
FIG. 15 is a diagram showing the circuit characteristics (access time) of cases 1 and 16, which are worst cases calculated by changing the fluctuation amount width (K value) of the device structure parameter.

FIG. 15 indicates the behavior of the access time $t_{AC}$ (ordinate axis) when the absolute value (abscissa axis) of the K value is changed as a parameter for the cases C1 and C16. From this, it is found that in order to estimate the maximum value of the strict access time in the case C1, the absolute K value is set at 2.35. Likewise, it is found that in order to estimate the minimum value of the strict access time in the case C16, the absolute K value is set at 2.4. The absolute K value coincides with the absolute K value introduced according to the behavior of the device characteristic in FIG. 12. That is, according to the procedure shown in FIG. 6, the K value is optimized to a device characteristic fluctuation shown in FIG. 12 in steps S5 to S7. Next, in step S8, the worst-case analysis is carried out on circuit characteristic fluctuation using the "K value after optimization". Consequently, fluctuation 25 of the circuit characteristic originating from process fluctuation can be estimated quickly and at high accuracy, which cannot be achieved in worst-case analysis.

By optimizing the circuit (optimization of the nominal value of the process parameter or optimization of the quantity of transistors) based on the result of fluctuation 25 or the circuit characteristic obtained according to the simulation method for the circuit characteristic of a semiconductor device, the process window can be widened, thereby achieving a high yield rate in mass production of the LSI.

As described above, it is possible to provide a simulator for the circuit characteristics of a semiconductor device and a simulation method capable of estimating fluctuation in the manufacturing process of the semiconductor device and fluctuation in the circuit characteristic quickly and at high accuracy.

(Manufacturing Method of Semiconductor Device)

Figure 16:
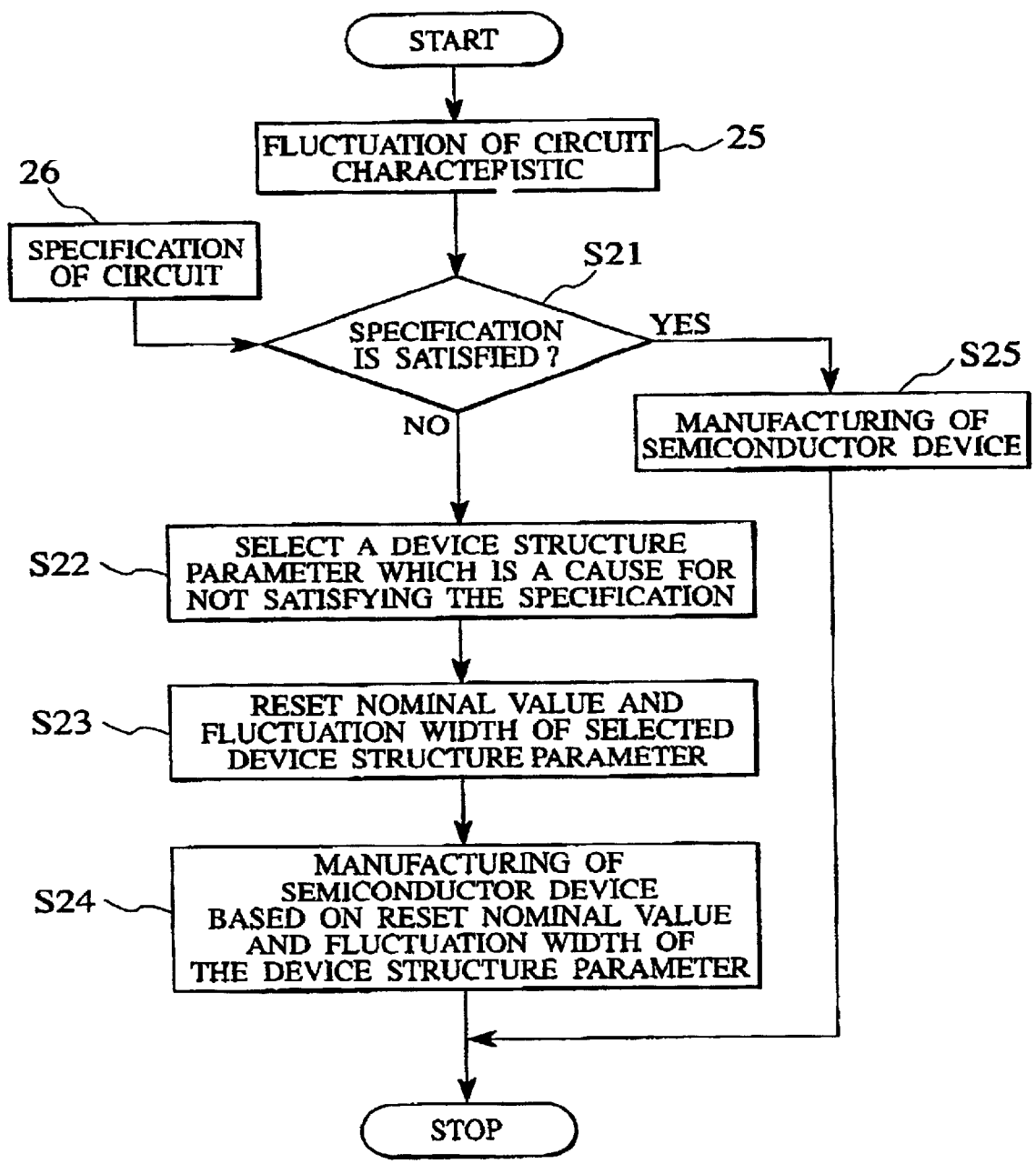
FIG. 16 is a flow chart of the manufacturing method of the semiconductor device.

Next, a manufacturing method of the semiconductor device according to the simulation method for the circuit characteristic of the semiconductor device will be described. The manufacturing method of the semiconductor device occurs according to the flow of the simulation method for the circuit characteristic of the semiconductor device shown in FIG. 6, and then that of FIG. 16. In the description below, the procedure after the step S21 is executed using the obtained fluctuation 25 of the circuit characteristic, will be described.

First, in step S21 using circuit characteristic determining unit 41 of FIG. 5, it is determined whether the specification 26 of the circuit has been satisfied, even if the circuit characteristic of the semiconductor device fluctuates, according to the fluctuation 25 of the circuit characteristic. If the specification 26 is satisfied, the semiconductor device is manufactured without changing an initial phase nominal design value of the device structure parameter in step S25. Then, manufacturing of the semiconductor device is complete.

When the device characteristic and circuit characteristic deflect from their specifications 26, the following two methods are available.

(Method 1)

A possible value of the device structure parameter is an initial phase nominal value plus a fluctuation width originated from a process condition. For example, the gate length L is expressed in the expression of L=L0+ΔL (L0: initial phase nominal design value, ΔL: fluctuation width). This fluctuation width ΔL originates from device manufacturing environment and accuracy/performance of manufacturing machine. Therefore, the fluctuation width ΔL is reduced by adjusting the manufacturing environment and the manufacturing machine. By this operation, disparities of the device characteristic and circuit characteristic are minimized, so that these characteristics can be maintained within the specification. However, reduction of the control width of the device structure parameter by adjustment of the manufacturing environment and manufacturing machine may be sometimes proved difficult.

(Method 2)

The initial phase nominal design value is changed. For example, in case of gate length L, the initial phase nominal design value L0 is changed. Then, the device characteristic and the circuit characteristic are realigned so that they satisfy the specification. This method is an optimization method called design centering.

Hereinafter, mainly the method 2 will be described.

If the specification 26 is not satisfied, in step S22, the device structure parameter which is a cause for not satisfying the specification is selected by the device structure parameter selecting unit 42 of FIG. 5. For example, assume that as shown in FIG. 15, the upper limit value of the specification of access time tAC is 4.8 nanoseconds. Because the upper limit value of the access time tAC is known to be 5.0 nanosecond from the fluctuation 25 in the circuit characteristic, in step S21, it is, determined that the specification is not satisfied. Because the specification is not satisfied, the processing proceeds to step S22. In step S22, a device structure parameter in which the device characteristic and circuit characteristic change largely with respect to the K value as shown in FIG. 10 is selected. In FIG. 10, for example, the fluctuation of the gate length (ΔL) is selected or fluctuations of ΔL and gate oxide film thickness (ΔTox) are selected.

In step S23, the settings of the initial phase nominal value of the selected device structure parameter are realigned, so that the device characteristic and the circuit characteristic satisfy the specification, using the resetting unit 44 for the nominal value of the device structure parameter and the fluctuation width in FIG. 5. For example, the selected gate length L and the initial phase nominal value of the gate oxide film thickness Tox are reset to new values.

Finally, in step S24, a semiconductor device is manufactured according to a newly set nominal design value of the device structure parameter.

As described above, according to the present invention, it is possible to provide a manufacturing method of the semiconductor device capable of estimating fluctuation of the circuit characteristics due to fluctuation of the manufacturing process quickly and with high precision, so as to suppress fluctuation of the circuit characteristics, which depend on the specification of the circuit characteristic.

Although the embodiment in which the present invention is applied to the MOS transistor has been described above, this can be applied to other devices such as Bipolar Junction Transistor (BJT), Ferroelectric Random Access Memory (FeRAM).

Various modifications will become possible for those skilled in the art after receiving the teachings of the present disclosure without departing from the scope thereof.

What is claimed is:

1. A simulation method for a circuit characteristic of a semiconductor devise, comprising:
    obtaining a first characteristic value of a characteristic of an element of the semiconductor devise fluctuating most by a fluctuation of a parameter of the element;
    determining a width of the fluctuation of the parameter of the element matching a second characteristic value of a worst case of the characteristic of the element with the first characteristic value; and
    determining a third characteristic value of a worst case of the circuit characteristic of the semiconductor device based on the width of the fluctuation of the parameter of the element,
    wherein obtaining the first characteristic value comprises:
        inputting a frequency distribution of the fluctuation of the parameter; and
        obtaining the first characteristic value using the fluctuation according to Monte Carlo analysis;
    wherein said determining the width of the fluctuation of the parameter comprises obtaining a standard deviation ($\sigma$) by approximating the frequency distribution to Gaussian distribution; and standardizing the width of the fluctuation with the standard deviation ($\sigma$), and said determining the third characteristic value comprises determining the third characteristic value according to the width of the standardized fluctuation.

2. A simulation method for a circuit characteristic of a semiconductor device, comprising:
    obtaining a first characteristic value of a characteristic of an element of the semiconductor devise fluctuating most by a fluctuation of a parameter of the element;
    determining a width of the fluctuation of the parameter of the element matching a second characteristic value of a worst case of the characteristic of the element with the first characteristic value; and
    determining a third characteristic value of a worst case of the circuit characteristic of the semiconductor device based on the width of the fluctuation of the parameter of the element,
    wherein the fluctuation width of the parameter is determined under a condition in which the value of the function F defined by:

$$F=[(x-x0)^2+(y-y0)^2]^{1/2}$$

is a minimum value, where (x, y) and (x0, y0) are characteristic values of the element having the second characteristic value and the first characteristic value.

3. A simulator for a circuit characteristic of a semiconductor device comprising:
    an input/output unit to input a frequency distribution of a fluctuation of a parameter of an element composing the semiconductor device;
    a Monte Carlo analyzing unit to obtain a first characteristic value of a characteristic of the element of the semiconducter device fluctuating most by the fluctuation of the parameter of the element;
    a first worst case analyzing unit to obtain a second characteristic value of a worst case of the characteristic of the element as a function of the fluctuation width of the parameter;
    a computing unit to determine a fluctuation width which matches the second characteristic value with the first characteristic value; and
    a second worst case analyzing unit to determine a third characteristic value of a worst case of the circuit characteristic of the semiconductor device based on the fluctuation width.

4. The simulator as in claim 3, further comprising:
    a circuit characteristic determining unit to determine whether or not the third characteristic value satisfies a specification of the circuit characteristic;
    a parameter selecting unit to select a parameter which is a cause for not satisfying the circuit characteristic; and
    a setting unit to set a nominal value of the selected parameter or a fluctuation width.

5. A manufacturing method of a semiconductor device comprising:
    obtaining a first characteristic value of a characteristic of an element of the semiconductor device fluctuating most by a fluctuation of a parameter of the element;
    determining a width of the fluctuation of the parameter of the element matching a second characteristic value of a worst case of the characteristic of the element with the first characteristic value;
    determining a third characteristic value of a worst case of the circuit characteristic of the semiconductor device based on the width of the fluctuation;
    determining whether or not the third characteristic value satisfies a specification of the circuit characteristic;
    selecting a parameter of the element which is a cause for not satisfying the circuit characteristic;
    setting a specification of the selected parameter; and
    manufacturing the semiconductor device according to the set specification of the parameter.

6. The manufacturing method as in claim 5, wherein said obtaining the first characteristic value comprises:
    inputting a frequency distribution of the fluctuation of the parameter; and
    obtaining the first characteristic value by the fluctuation according to Monte Carlo analysis.

7. The manufacturing method as in claim 6, wherein said determining the width of the fluctuation of the parameter comprises obtaining a standard deviation ($\sigma$) by approximating the frequency distribution to Gaussian distribution; and standardizing the width of the fluctuation with the standard deviation ($\sigma$), and said determining the third characteristic value comprises determining the third characteristic value according to the width of the standardized fluctuation.

8. The manufacturing method as in claim 5, wherein the fluctuation width of the parameter is determined under a condition in which the value of the function F defined by:

$$F=[(x-x0)^2+(y-y0)^2]^{1/2}$$

a minimum value, where (x, y) and (x0, y0) are characteristic values of the element having the second characteristic value and the first characteristic value.

9. The manufacturing method as in claim 5, wherein the element is a field effect transistor, the parameter is at least one of gate length and gate oxide film thickness.

10. The manufacturing method as in claim 9, wherein the parameter is at least one of channel impurity concentration and diffusion layer resistance.

11. The manufacturing method as in claim 5, wherein the element is a field effect transistor, the characteristic of the element is at least one of drive current and threshold voltage.

12. The manufacturing method as in claim 5, wherein the circuit characteristic is at least one of access time, propagation delay time, frequency and power consumption.

* * * * *